US011496101B2

(12) United States Patent
Alon et al.

(10) Patent No.: US 11,496,101 B2
(45) Date of Patent: Nov. 8, 2022

(54) RF TRANSCEIVER FRONT END MODULE WITH IMPROVED LINEARITY

(71) Applicant: Skyworks Solutions, Inc., Irvine, CA (US)

(72) Inventors: Ziv Alon, Thousand Oaks, CA (US); Maxwell L. Thomas, Newbury Park, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 200 days.

(21) Appl. No.: 16/422,593

(22) Filed: May 24, 2019

(65) Prior Publication Data

US 2019/0386621 A1 Dec. 19, 2019

Related U.S. Application Data

(62) Division of application No. 14/715,307, filed on May 18, 2015, now Pat. No. 10,333,474.

(Continued)

(51) Int. Cl.
*H03F 3/19* (2006.01)
*H03F 3/24* (2006.01)
*H04B 1/04* (2006.01)
*H03F 3/21* (2006.01)
*H04W 88/02* (2009.01)
(Continued)

(52) U.S. Cl.
CPC .............. *H03F 3/19* (2013.01); *H03F 1/0227* (2013.01); *H03F 1/3247* (2013.01); *H03F 3/21* (2013.01); *H03F 3/245* (2013.01); *H04B 1/0475* (2013.01); *H04B 1/30* (2013.01); *H04W 88/02* (2013.01); *H03F 2200/451* (2013.01);
(Continued)

(58) Field of Classification Search
CPC .......... H03F 3/19; H03F 3/245; H03F 1/0227; H03F 1/3247; H03F 3/21; H03F 2201/3224; H03F 2200/451; H04W 88/20; H04W 88/02; H04B 1/30; H04B 1/0475; H04B 2001/0433; H04B 2001/0425

See application file for complete search history.

(56) References Cited

U.S. PATENT DOCUMENTS 8,278,963 B2  10/2012  Rabjohn et al.
8,718,188 B2   5/2014  Balteanu et al.
(Continued)

FOREIGN PATENT DOCUMENTS

| CN | 102904532 A | 1/2013 |
| KR | 10-2007-0029306 | 3/2007 |
| KR | 10-2014-0000321 | 1/2014 |

OTHER PUBLICATIONS

Chinese Office Action for Application No. 201580030880.X dated Jul. 4, 2018 in 10 pages.

(Continued)

*Primary Examiner* — Charles C Jiang
*Assistant Examiner* — Voster Preval
(74) *Attorney, Agent, or Firm* — Knobbe, Martens, Olson & Bear, LLP

(57) ABSTRACT

A power amplifier system front end measures both forward and reverse power associated with an RF transmit signal. A processor is configured to use measurements derived from the measured forward and reverse power output to adjust the RF transmit signal in order to compensate for one or more memory effects of the power amplifier system.

20 Claims, 9 Drawing Sheets

Related U.S. Application Data

(60) Provisional application No. 62/005,769, filed on May 30, 2014, provisional application No. 62/000,989, filed on May 20, 2014, provisional application No. 62/000,455, filed on May 19, 2014.

(51) Int. Cl.
*H04B 1/30* (2006.01)
*H03F 1/02* (2006.01)
*H03F 1/32* (2006.01)

(52) U.S. Cl.
CPC .............. *H03F 2201/3224* (2013.01); *H04B 2001/0425* (2013.01); *H04B 2001/0433* (2013.01)

(56) References Cited

U.S. PATENT DOCUMENTS

| | | | |
|---|---|---|---|
| 8,723,531 B2 | 5/2014 | Harrison | |
| 8,981,847 B2 | 3/2015 | Balteanu | |
| 8,989,682 B2 | 3/2015 | Ripley et al. | |
| 10,333,474 B2 | 6/2019 | Alon et al. | |
| 2008/0051042 A1 | 2/2008 | Komaili et al. | |
| 2009/0033418 A1 | 2/2009 | Ericson | |
| 2009/0054016 A1 | 2/2009 | Waheed et al. | |
| 2009/0115513 A1 | 5/2009 | Hongo | |
| 2011/0098011 A1 | 4/2011 | Camp et al. | |
| 2012/0051409 A1* | 3/2012 | Brobston | H03H 7/40 333/124 |
| 2012/0149316 A1 | 6/2012 | Firouzkouhi et al. | |
| 2012/0200354 A1 | 8/2012 | Ripley | |
| 2012/0219048 A1* | 8/2012 | Camuffo | H03F 1/3247 375/296 |
| 2012/0293187 A1 | 11/2012 | Morris, III | |
| 2013/0027023 A1 | 1/2013 | Rabjohn et al. | |
| 2013/0027129 A1* | 1/2013 | Langer | H03F 1/56 330/127 |
| 2013/0169357 A1 | 7/2013 | Drogi et al. | |
| 2013/0226489 A1* | 8/2013 | Sogl | G01R 29/26 702/69 |
| 2013/0234741 A1* | 9/2013 | Mow | H01Q 5/328 324/750.01 |
| 2014/0213204 A1 | 7/2014 | Balteanu et al. | |
| 2014/0266423 A1* | 9/2014 | Drogi | H03F 1/32 330/75 |
| 2014/0274227 A1* | 9/2014 | Drogi | H03F 3/24 455/574 |
| 2014/0341318 A1* | 11/2014 | Pourkhaatoun | H04W 52/0258 375/297 |
| 2015/0072632 A1 | 3/2015 | Pourkhaatoun | |
| 2016/0164551 A1* | 6/2016 | Khlat | H03F 3/19 330/297 |
| 2017/0317686 A1 | 11/2017 | Dartois | |

OTHER PUBLICATIONS

Notice of Allowance for Chinese Application No. 201580030880.X dated Jan. 21, 2019 (includes translation).

International Search Report for PCT Application No. PCT/US2015/033038, dated Sep. 9, 2015 in 14 pages.

* cited by examiner

| VSWR | PHASE (deg) | CHANNEL | BAND | DELAY OFFSET (ns) (VAR A) | AM-AM COEFFICEINTS, 9th ORDER POLYNOMINAL (VAR B) | AM-PM COEFFICEINTS, 9th ORDER POLYNOMINAL (VAR C) |
|---|---|---|---|---|---|---|
| 1.2 | 0 | 20525 | B5 | 1.11 | 0.98,0.2,0.17,... | 0.1,−0.02,0.001,... |
| 1.2 | 45 | 20525 | B5 | 1.25 | 0.97,0.18,0.19,... | 0.11,−0.01,0.002,... |
| 1.2 | 90 | 20525 | B5 | 3.62 | 0.95,0.22,0.07,... | 0.13,0.01,−0.001,... |
| 1.2 | 135 | 20525 | B5 | 5.21 | 0.92,0.3,0.02,... | 0.12,−0.01,0.003,... |
| 1.2 | 180 | 20525 | B5 | 3.72 | 0.9,0.15,0.01,... | 0.12,−0.01,0.002,... |
| 1.2 | 225 | 20525 | B5 | 2.28 | 0.93,0.1,0.11,... | 0.11,0.01,−0.002,... |
| ...OTHER VSWRs | ...OTHER PHASES | ...OTHER CHANNELS | ...OTHER BANDS | | | |

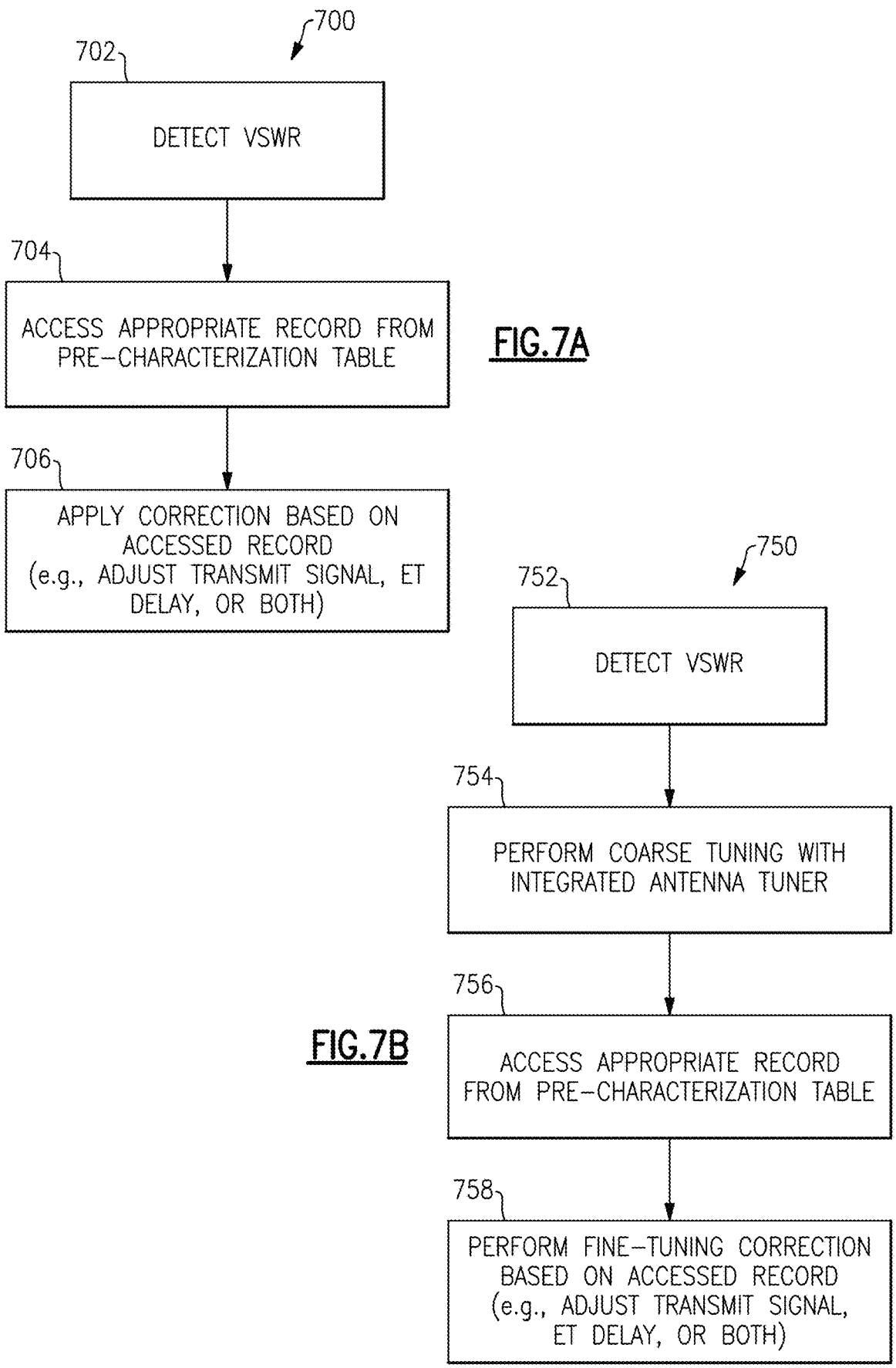

RF TRANSCEIVER FRONT END MODULE WITH IMPROVED LINEARITY

INCORPORATION BY REFERENCE TO ANY PRIORITY APPLICATIONS

Any and all applications, if any, for which a foreign or domestic priority claim is identified in the Application Data Sheet of the present application are hereby incorporated by reference under 37 CFR 1.57.

BACKGROUND

Field

Embodiments of the invention relate to electronic systems, and in particular, to systems including power amplifiers for radio frequency (RF) electronics.

Description of the Related Technology

Power amplifiers can be included in mobile devices to amplify a RF signal for transmission via an antenna. For example, in mobile devices having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal having a relatively low power. Power amplifiers can be included in mobile device front end modules that also include duplexers, antenna switch modules, and couplers. Modern front end modules can experience significant performance impairment under certain circumstances, including degraded linearity.

SUMMARY

Embodiments are described herein for addressing these and other problems. For instance, degraded linearity can be of particular concern for front end modules that operate across multiple frequency bands and in multiple modes, such as one or more of an average power tracking (APT) mode, envelope tracking (ET) mode, digital pre-distortion (DPD) mode (e.g., fixed supply or ET DPD modes), etc. One problem is degraded linearity (e.g., adjacent channel leakage ration [ACLR]) when mismatch is presented at the antenna. This can be especially the case under ET DPD mode when the power amplifier is driven with a wideband signal such as a 50 resource-block Long-Term Evolution signal (50 RB LTE). In such a case, a degradation of 10 Decibels (dB) may be present, e.g., when a 5:1 voltage standing wave ratio (VSWR) is presented at the antenna. Such degradation can become progressively worse when the modulation bandwidth is increased. Thus, it can be particularly helpful to compensate for this degradation under ET and high modulation bandwidth cases.

Performance degradation can be exacerbated by the duplexer, such as when the system is in ET mode. For instance, group delay inherent in the duplexer combined with poor match can result in memory effects, e.g., where the system gain shape (e.g., AM-AM/AM-PM) varies across the transmitted RB bandwidth (i.e. the channel). Moreover, AM-AM (amplitude-to-amplitude) and/or AM/PM (amplitude-to-phase) response variations are often experienced across various mismatch conditions (even for narrow band signals) due to PA compression point variation over mismatch. Typical open loop, memory-less DPD is often insufficient to address gain shape variation within the transmitted bandwidth. Thus, certain embodiments disclosed herein adjust the DPD for memory or otherwise account for memory (i.e. gain shape variation across the channel) as well as the particular mismatch state at the antenna. In addition, the proper (e.g., optimum) delay applied between the modulator and RF signal (for ET operation) is also a function of the VSWR state and varies within the TX channel. Thus, certain embodiments described herein also adapt such delay within the transmitted bandwidth.

According to certain aspects of the disclosure, systems and methods are provided for improving mobile device front end module performance (e.g., linearity) over mismatch. This can be achieved without incurring significant additional or loss of performance under nominal conditions. Depending on the particular implementation, embodiments provided herein can provide this such benefits in ET mode, APT mode, DPD mode, or combinations thereof, such as in a combined DPD/ET mode.

A power amplifier system is provided according to at least one aspect of the disclosure. The system includes a modulator configured to generate a radio frequency (RF) transmit signal and a front end module. The front end module can include a power amplifier configured to amplify the RF transmit signal to generate an amplified RF transmit signal. The front end module can also include a coupler positioned between an antenna and the power amplifier. The coupler can be configured to output a measure of both forward and reverse power associated with the RF transmit signal. The coupler is a dual directional coupler in some embodiments. The system can additionally include a non-volatile memory storing an equalizer table. The equalizer table can have a plurality of entries generated during a pre-characterization of the front-end module. The system can also include a processor configured to (a) receive voltage standing wave ratio (VSWR) measurements derived from the forward and reverse power output by the coupler, (b) access entries in the equalizer table based at least in part on the VSWR measurements, and (c) adjust the RF transmit signal based on the accessed entries to compensate for one or more memory effects present in the power amplifier system. For instance, the system can include a digital pre-distortion table (DPD), where the processor is configured to adjust the RF transmit signal by adapting values in the DPD table based on the accessed entries in the equalizer table. The system can be in the form of a mobile device, which can further include an antenna configured to receive the amplified RF signal from the front end module.

The front end module of the power amplifier system can be configured in a variety of different ways. The equalizer table in some cases is generated using a programmable antenna tuner to tune the front end module to desired VSWR points. In some configurations the front end module does not include an integrated antenna tuner. A programmable antenna tuner can be included in the front end module and positioned between the antenna and the coupler in some implementations. The programmable antenna tuner can be adjustable to tune an impedance seen by the power amplifier in order to provide a coarse correction of non-linearity within the power amplifier system. The adjustment of the RF transmit signal based on the accessed entries may provide fine correction of non-linearity within the power amplifier system. The front end module can include one or more duplexers positioned between the power amplifier and the dual directional coupler. In some cases the duplexors contribute to at least some of the memory effects.

The power amplifier system can additionally include an envelope tracking system configured to provide a power supply control signal to the power amplifier to control a voltage level of the power amplifier based on a shaped envelope signal. The processor in some cases is further configured to adjust a delay between the RF transmit signal and the supply control signal based on delay values included in the accessed equalizer table entries.

A method of characterizing a front end module of a wireless device is provided according to additional aspects of the disclosure. The method can include using a programmable antenna tuner to tune an impedance load at an output of a power amplifier of the front end module so as to achieve a voltage standing wave ratio (VSWR) value associated with a first characterization state of a plurality of front end module characterization states. The method can also include driving the front end module with an RF transmit signal. The RF transmit signal can be driven according to one or more additional parameter values associated with the first characterization state. The method can further include measuring one or more variables associated with behavior of the front end module while the front end module is driven with the RF transmit signal and tuned to the VSWR values. The one or more recorded variables can include a power amplifier compression, a maximum envelope power, and/or a delay between a power control signal for the power amplifier and the RF transmit signal. The method can also include recording the one or more measured variables in association with the first characterization state in a table in non-volatile memory. The steps of using, driving, measuring, and recording can be repeated for a plurality of additional characterization states of the plurality of front end module characterization states. The programmable antenna tuner is separate from the front end module in some cases, where the front end module does not include an antenna tuner. The programmable antenna tuner is integrated into the front end module in some other implementations.

A power amplifier system according to yet further aspects includes a front end module including a power amplifier configured to amplify an RF transmit signal to generate an amplified RF transmit signal. The front end module can also include a programmable antenna tuner coupled to an antenna. A coupler of the front end module can be positioned between the power amplifier and the antenna tuner, the coupler configured to output a measure of both forward and reverse power associated with the RF signal. The antenna tuner can be adjustable to tune an impedance seen by the power amplifier in order to provide a coarse correction of non-linearity within the power amplifier system. The system can further include non-volatile memory storing an equalizer table having a plurality of entries generated during a pre-characterization of the front-end module. The system can also include processor configured to (a) receive voltage standing wave ratio (VSWR) measurements derived from the forward and reverse power output by the coupler, (b) access entries in the equalizer table based at least in part on the VSWR, and (c) adjust the RF transmit signal based on the accessed entries. The front end module can additionally include a duplexer in some configurations.

BRIEF DESCRIPTION OF THE DRAWINGS

FIGS. 6A-6B show examples of partial equalizer lookup tables for an exemplary front end module showing pre-characterized values for select variables at different characterization states.

FIG. 7A shows a flow chart depicting a process for compensating front end module operation using an equalizer lookup table.

FIG. 7B shows a flow chart depicting another process for compensating front end module operation through the combined use of coarse tuning with an integrated antenna tuner and fine tuning using an equalizer lookup table.

DETAILED DESCRIPTION OF EMBODIMENTS

The headings provided herein, if any, are for convenience only and do not necessarily affect the scope or meaning of the claimed invention.

Figure 1:
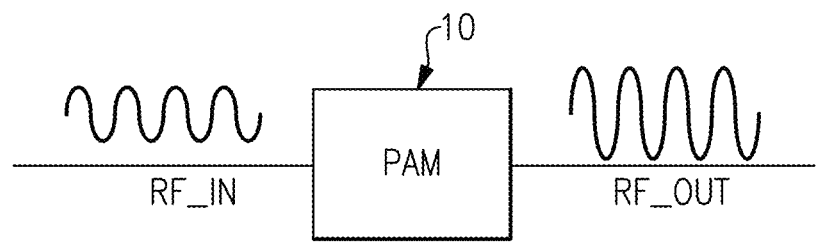
FIG. 1 is a schematic diagram of a power amplifier module for amplifying a radio frequency (RF) signal.

FIG. 1 is a schematic diagram of a power amplifier module (PAM) 10 for amplifying a radio frequency (RF) signal. The illustrated power amplifier module 10 can be configured to amplify a RF signal RF_IN to generate an amplified RF signal RF_OUT. As described herein, the power amplifier module 10 can include one or more power amplifiers.

Figure 2:
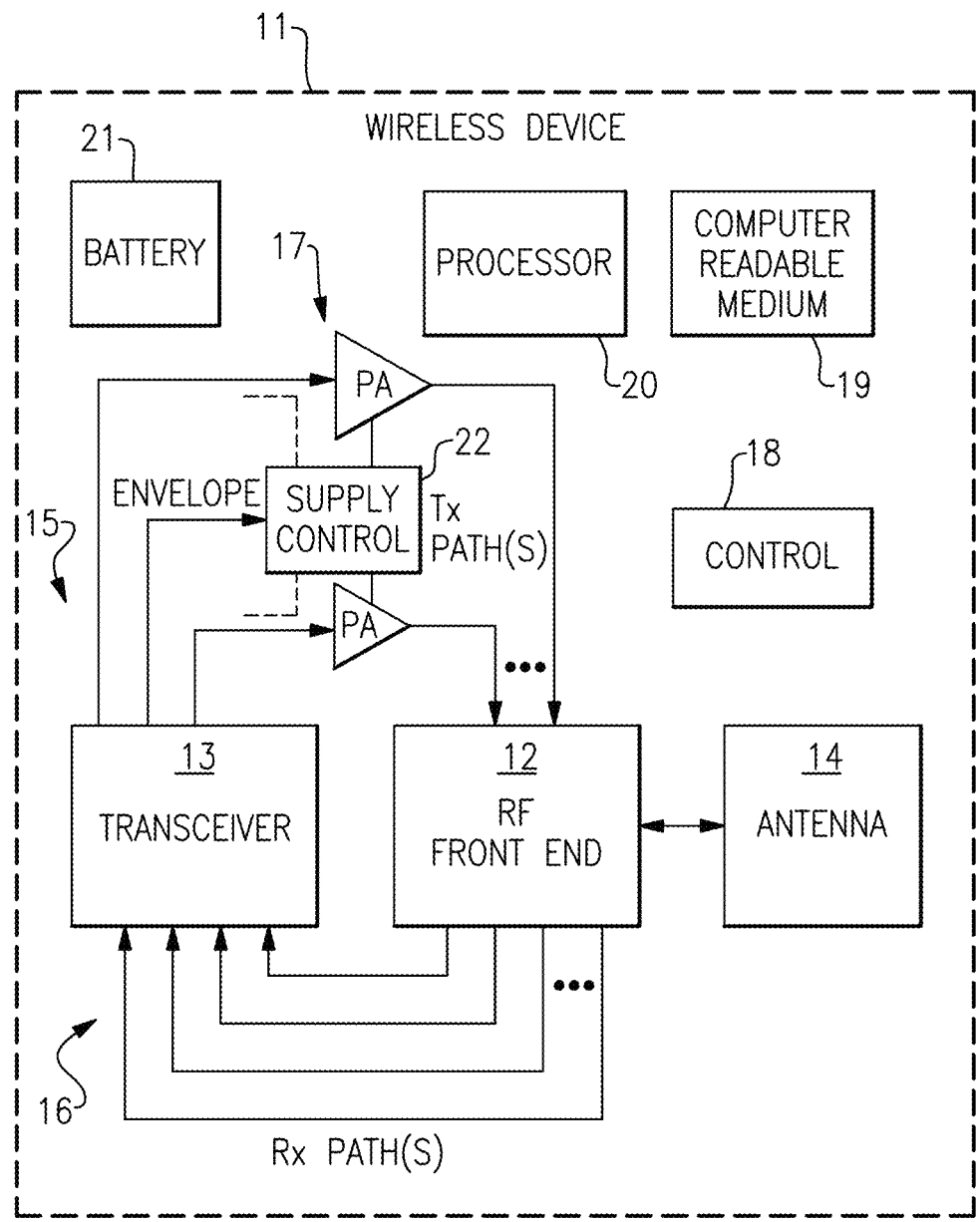
FIG. 2 is a schematic block diagram of an example wireless device.

FIG. 2 is a schematic block diagram of an example wireless device 11 that can include one or more of the power amplifier modules 10 of FIG. 1. The wireless device 11 can include power amplifiers 17 and an RF front end 12 implementing one or more features of the present disclosure. For instance, the power amplifiers 17 and RF front end 12 according to some embodiments are configured to compensate for non-linearities, including those caused by memory effects resulting from impedance mismatch seen by the power amplifiers 17. In particular, duplexers coupled to the output power amplifiers 17 can include or operate as filters that add corresponding frequency response components to the system on top of other distortion, creating memory effects. For instance, duplexers can present mismatch that is not flat across transmit channel/band, causing non-linear power amplifier behavior.

Such compensation can involve the utilization of a lookup table or other data structure, where appropriate lookup table entries are access based on measurements taken during operation, such as voltage standing wave ratio (VSWR) measurements or other measurements relating to complex impedance seen by the power amplifiers 17. Values in the lookup table according to certain implementations are obtained during a characterization phase, where a programmable antenna tuner is used to record certain variables characterizing the behavior of the system. For instance, AM-AM and/or AM-PM response curves for the power amplifier 17 can be captured across a variety of operating states. Such techniques and associated componentry will be described in further detail herein.

While the power amplifiers 17 and RF front end 12 are described in some cases as separate components, some or all of the power amplifiers 17 can also form part of the RF front end 12, such as in embodiments where the RF front end 12 is a highly integrated component that includes the power amplifiers 17. The combination of the power amplifiers 17 and RF front end 12 can together be referred to as a front end module.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more features of the present disclosure can be implemented in the foregoing example modes and/or bands, and in other communication standards. For example, 3G and 4G are non-limiting examples of such standards.

The illustrated wireless device 11 includes a RF front end 12, a transceiver 13, an antenna 14, power amplifiers 17, a control component 18, a computer readable medium 19, a processor 20, a battery 21, and a supply control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates the wireless device 11 as including two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 2 illustrates the wireless device 11 as including four receiving paths 16, the wireless device 11 can be adapted to include more or fewer receiving paths 16.

To facilitate switching between receive and transmit paths, the one or more switches in the RF front end 12 can be configured to electrically connect the antenna 14 to a selected transmit or receive path. Thus, the switches can provide a number of switching functionalities associated with operation of the wireless device 11. In certain embodiments, the switches can include a number of switches configured to provide functionalities associated with, for example, switching between different bands, switching between different power modes, switching between transmission and receiving modes, or some combination thereof. The switches can also be configured to provide additional functionality, including filtering and/or duplexing of signals.

FIG. 2 shows that in certain embodiments, a control component 18 can be provided for controlling various control functionalities associated with operations of the RF front end, the power amplifiers 17, the supply control 22, and/or other operating components. The control component 18 can in some cases be included within another component shown in FIG. 2, such as the transceiver 13, for example.

In certain embodiments, a processor 20 can be configured to facilitate implementation of various processes described herein. In certain implementations, the processor 20 can operate using computer program instructions. In certain embodiments, these computer program instructions may also be stored in a computer-readable memory 19 that can direct a computer or other programmable data processing apparatus to operate in a particular manner. For example, For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The supply control block 22 can be electrically connected to the battery 21, and the supply control block 22 can be configured to change the voltage provided to the power amplifiers 17, e.g., based on an envelope of the RF signal to be amplified. The battery 21 can be any suitable battery for use in the wireless device 11, including, for example, a lithium-ion battery. As will be described in detail further below, by controlling the voltage level of the power amplifier supply voltage provided to the power amplifiers, the power consumption of the battery 21 can be reduced, thereby improving performance of the wireless device 11. As illustrated in FIG. 2, the envelope signal can be provided to the supply control block 22 from the transceiver 13. However, the envelope can be determined in other ways. For example, the envelope or other type of supply control signal can be determined by processing the RF signal (e.g., detecting the envelope using any suitable envelope detector).

Figure 8A:
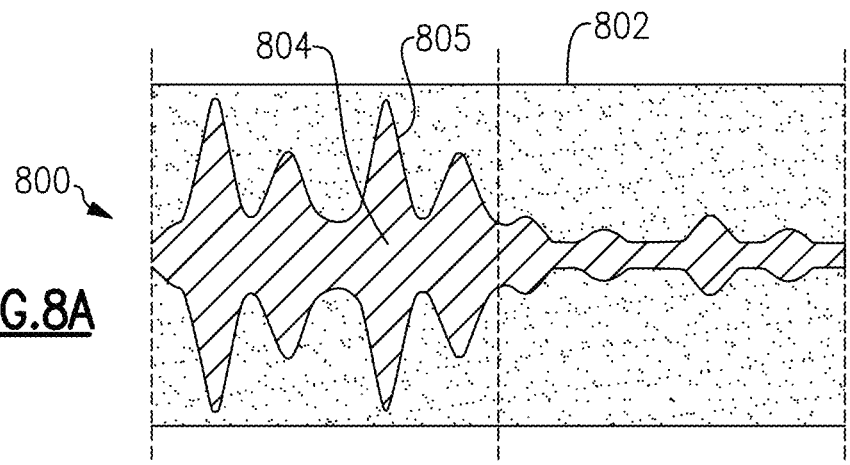
FIGS. 8A-8C show power amplifier signal and supply waveforms for power amplifiers operating in a fixed supply voltage mode, average power tracking mode, and envelope tracking mode, respectively.
Figure 8B:
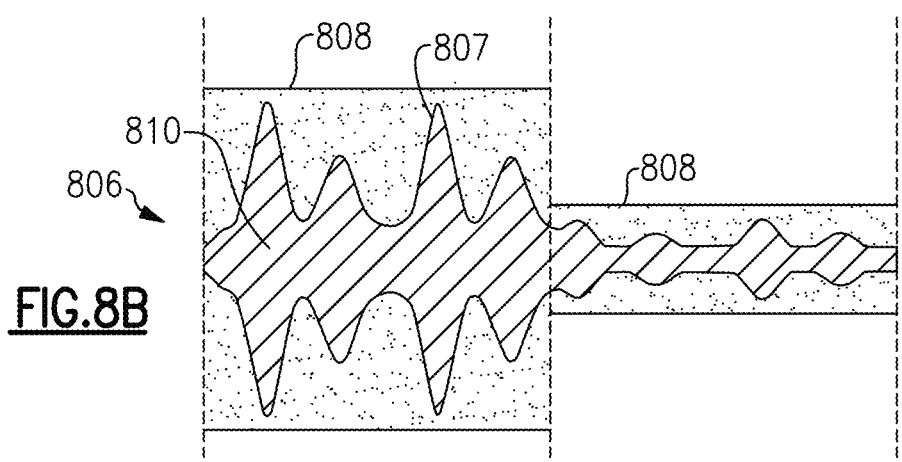
Figure 8C:
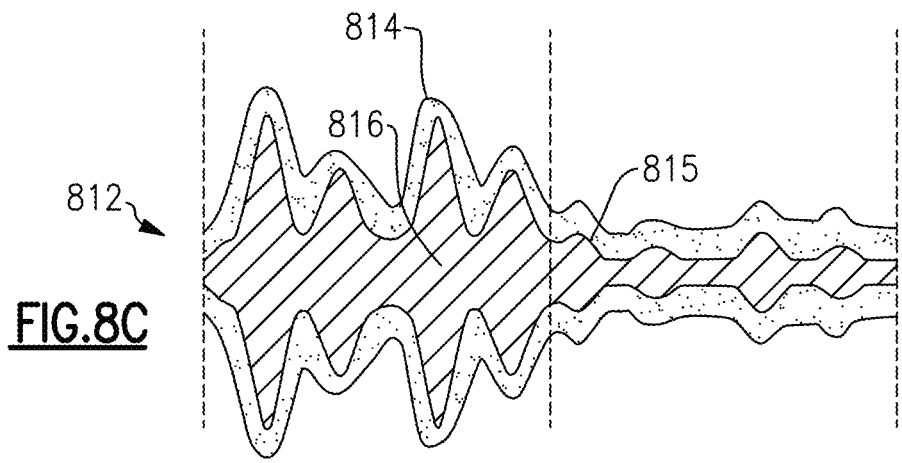

One technique for reducing power consumption of a power amplifier is envelope tracking (ET), in which the voltage level of the power supply of the power amplifier is changed in relation to the envelope of the RF signal. For example, when the envelope of the RF signal increases the voltage level of the power amplifier's power supply can be increased. Likewise, when the envelope of the RF signal decreases the voltage level of the power amplifier's power supply can be decreased to reduce power consumption. Another form of power tracking is average power tracking (APT), in which the voltage level of the power supply of the power amplifier 17 is changed in relation to the envelope, similar to envelope tracking. However, in APT mode of operation, the power supply is changed between two or more discrete values based on an average level of the envelope. For example, the power level can be changed on a slot-by-slot basis, where each slot corresponds to a different power control level. This can improve efficiency at low power while resulting in less power savings at higher levels than ET tracking. Another mode of power supply control is a fixed supply or direct battery connection, where the power supply to the power amplifier 17 is held at a fixed amount, at or above the maximum level of the envelope of the RF signal. Example power and signal waveforms generated during example fixed power supply, average power tracking, and envelope tracking operations are shown in FIGS. 8A, 8B, and 8C, respectively.

Figure 3:
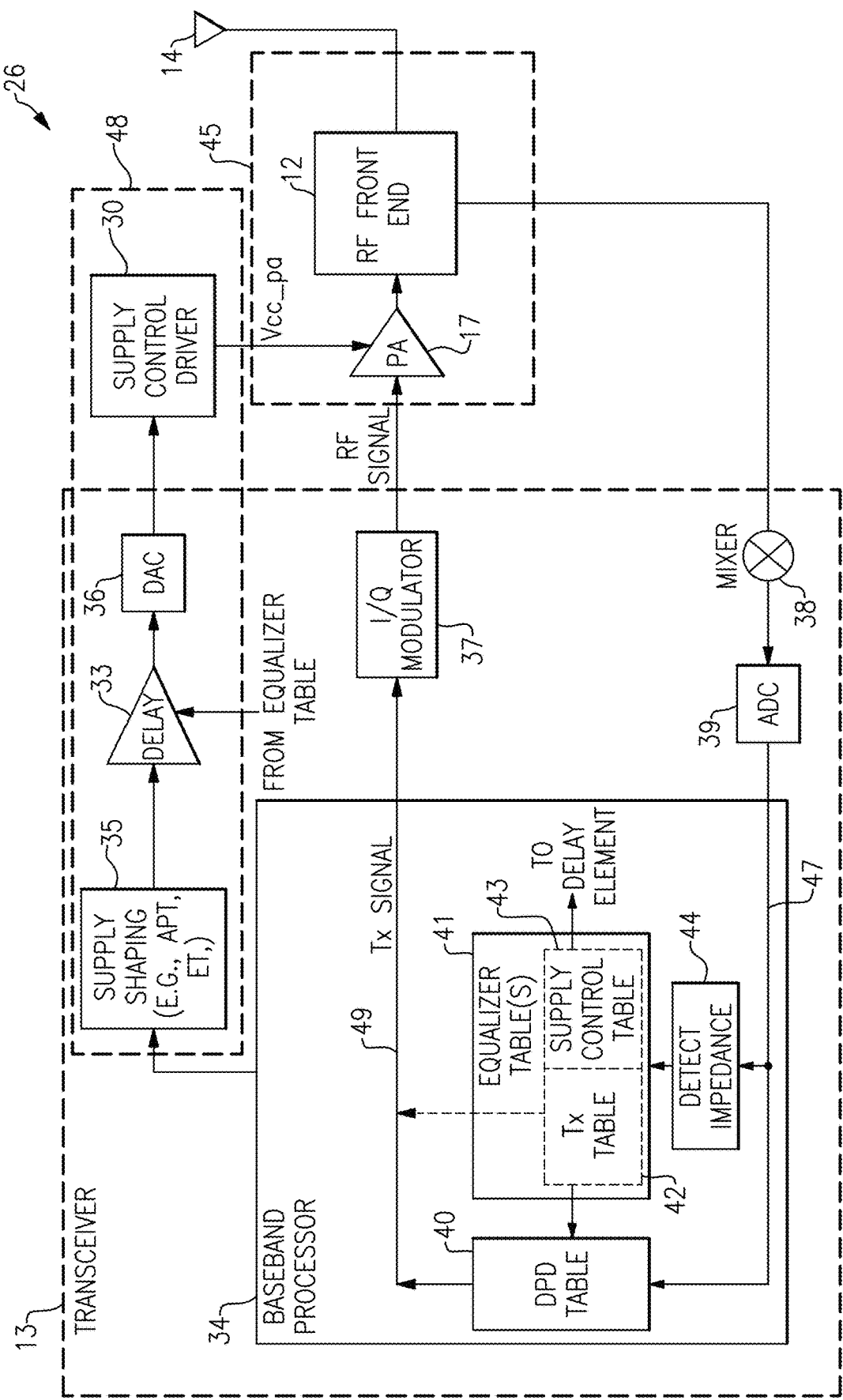
FIG. 3 is a schematic block diagram of one example of a power amplifier system including a transceiver and a front end module according to certain embodiments.

FIG. 3 is a schematic block diagram of one example of a power amplifier system 26. For example, the power amplifier system 26 may be incorporated into the wireless device 11. The illustrated power amplifier system 26 includes an RF front end 12, an antenna 14, a battery 21, a supply control driver 30, a power amplifier 17, and a transceiver 13. The illustrated transceiver 13 includes a baseband processor 34, a supplying shaping block or circuit 35, a delay component 33, a digital-to-analog converter (DAC) 36, a quadrature (I/Q) modulator 37, a mixer 38, and an analog-to-digital converter (ADC) 39. The supply shaping block 35, delay component 33, DAC 36, and supply control driver 30 together form a supply shaping branch 48.

The baseband processor 34 can be used to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate an RF signal. For example, the I/Q modulator 37 can include DACs configured to convert the I and Q signals into an analog format, mixers for upconverting the I and Q signals to radio frequency, and a signal combiner for combining the upconverted I and Q signals into an RF signal suitable for amplification by the power amplifier 17. In certain implementations, the I/Q modulator 37 can include one or more filters configured to filter frequency content of signals processed therein.

The supply shaping block 35 can be used to convert an envelope or amplitude signal associated with the I and Q signals into a shaped power supply control signal, such as an average power tracking (APT) signal or an envelope tracking (ET) signal, depending on the embodiment. Shaping the envelope signal from the baseband processor 34 can aid in enhancing performance of the power amplifier system 26. In certain implementations, such as where the supplying shaping block is configured to implement an envelope tracking function, the supply shaping block 35 is a digital circuit configured to generate a digital shaped envelope signal, and the DAC 36 is used to convert the digital shaped envelope signal into an analog shaped envelope signal suitable for use by the supply control driver 30. However, in other implementations, the DAC 36 can be omitted in favor of providing the supply control driver 30 with a digital envelope signal to aid the supply control driver 30 in further processing of the envelope signal.

The supply control driver 30 can receive the supply control signal (e.g., an analog shaped envelope signal or APT signal) from the transceiver 13 and a battery voltage $V_{BATT}$ from the battery 21, and can use the supply control signal signal to generate a power amplifier supply voltage $V_{CC\_PA}$ for the power amplifier 17 that changes in relation to the transmit signal. The power amplifier 17 can receive the RF transmit signal from the I/Q modulator 37 of the transceiver 13, and can provide an amplified RF signal to the antenna 14 through the RF front end 12. In other cases, a fixed power amplifier supply voltage $V_{CC\_PA}$ is provided to the power amplifier 17. In some such embodiments, one or more of the supply shaping block 35, DAC 36, and supply control driver 30 may not be included. Exemplary waveforms of power amplifier supply voltage $V_{CC\_PA}$ and corresponding RF transmit signals are shown in FIGS. 8A, 8B, and 8C for fixed supply, APT, and ET power supply control operations, respectively. In some embodiments, the power amplifier system 26 is capable of performing two or more supply control techniques. For instance, the power amplifier system 26 allows for selection (e.g., via firmware programming or other appropriate mechanism) of two or more of ET, APT, and fixed power supply control modes. In such cases, the baseband processor or other appropriate controller or processor may instruct the supply shaping block 35 to enter into the appropriate selected mode.

The delay component 33 implements a selectable delay in the supply control path. As will be described in further detail, this can be useful in some cases for compensating for non-linearities and/or other potential sources of signal degradation. The illustrated delay component is shown in the digital domain as part of the transceiver 13, and may comprise a FIFO or other type of memory-based delay element. However, the delay component 33 can be implemented in any appropriate fashion, and in other embodiments may be integrated as part of the supply shaping block 35, or may be implemented in the analog domain, after the DAC 36, for example.

The RF front end 12 receives the output of the power amplifier 17, and can include a variety of components including one or more duplexers, switches (e.g., formed in an antenna switch module), directional couplers, and the like. Detailed examples of compatible RF front ends are shown and described below with respect to FIGS. 4A and 4B.

The directional coupler (not shown) within the RF front end 12 can be a dual directional coupler or other appropriate coupler or other device capable of providing a sensed output signal to the mixer 38. According to certain embodiments, including the illustrated embodiment, the directional coupler is capable of providing both incident and reflected signals (e.g., forward and reverse power) to the mixer 38. For instance, the directional coupler can have at least four ports, which may include an input port configured to receive signals generated by the power amplifier 17, an output port coupled to the antenna 14, a first measurement port configured to provide forward power to the mixer 38, and a second measurement port configured to provide reverse power to the mixer 38.

The mixer 38 can multiply the sensed output signal by a reference signal of a controlled frequency (not illustrated in FIG. 3) so as to downshift the frequency spectrum of the sensed output signal. The downshifted signal can be provided to the ADC 39, which can convert the downshifted signal to a feedback signal 47 in a digital format suitable for processing by the baseband processor 34. As will be discussed in further detail, by including a feedback path between the output of the power amplifier 17 and an input of the baseband processor 34, the baseband processor 34 can be configured to dynamically adjust the I and Q signals and/or power control signal associated with the I and Q signals to optimize the operation of the power amplifier system 26. For example, configuring the power amplifier system 26 in this manner can aid in controlling the power added efficiency (PAE) and/or linearity of the power amplifier 32. The mixer 38, ADC 39 and/or other appropriate componentry may generally perform an quadrature (I/Q) demodulation function in some embodiments.

Although the power amplifier system 26 is illustrated as include a single power amplifier, the teachings herein are applicable to power amplifier systems including multiple power amplifiers, including, for example, multi-mode and/or multi-mode power amplifier systems.

Additionally, although FIG. 3 illustrates a particular configuration of a transceiver, other configurations are possible, including for example, configurations in which the transceiver 13 includes more or fewer components and/or a different arrangement of components.

As shown the baseband processor 34 can include a digital pre-distortion (DPD) table 40, an equalizer table 41, and a complex impedance detector 44. The DPT table 40 may be stored in a non-volatile memory (e.g., flash memory, read only memory (ROM), etc.) of the transceiver 34 that is accessible by the baseband processor 34. According to some embodiments, the baseband processor 34 accesses entries in the DPD table 40 to aid in linearizing the power amplifier 17. For instance, the baseband processor 34 selects appropriate entries in the DPD table 40 based on the sensed feedback signal 47, and adjusts the transmit signal accordingly, prior to outputting the transmit signal to the I/Q modulator 37. For example, DPD can be used to compensate for certain non-linear effects of the power amplifier 17, including, for example, signal constellation distortion and/or signal spectrum spreading. According to certain embodiments including the illustrated embodiment, the DPD table 40 implements memoryless DPD, e.g., where the current output of the DPD corrected transmit signal depends only on the current input.

Overview of Equalization Using a Lookup Table with Values Obtained by Pre-Characterizing the RF Front End Certain factors can contribute to memory effects that are difficult to deal with using purely memoryless DPD via the DPD table 40, such as group delay inherent in the duplexer of the RF front end 12 combined with poor impedance matching seen by the power amplifier 17. In order to compensate for such memory effects and/or other factors contributing to non-linearities or other signal degradation, the power amplifier system 26 can employ the equalizer table 41. The equalizer table 41 can be stored in a non-volatile memory (e.g., flash memory, read only memory (ROM), etc.), which can be the same memory that the DPD table 40 is stored in, or a different memory, depending on the embodiment. While the DPD table 40 and equalizer table 41 are shown as residing within the baseband processor 34 for the purposes of illustration, the memory devices containing the tables may reside in any appropriate location on the transceiver 13, or elsewhere in the wireless device 11.

The equalizer table 41 is populated during a characterization phase, which can be carried out at the point of manufacture, for example, where the power amplifier system 26 is characterized under select input conditions. During characterization, the power amplifier system 26 can be characterized at select complex impedance points, where certain variables are recorded at each complex impedance point. For instance, a programmable antenna tuner can be connected to the power amplifier system 26 during characterization to set the desired complex impedance points. The system can additionally be characterized across other appropriate parameters. As an example, in some embodiments the variables are additionally recorded across different channels and bands, which can allow for adaptation of the power amplifier system 26 (e.g., adaptation of the DPT table 40) for duplexer ripple across a transmit channel, accounting for some memory effects, among other benefits. The dual directional coupler or other appropriate component can be used to capture the behavior of the power amplifier system 26 at each set point (e.g., each characterized combination of phase, VSWR, channel, and band). Each of the recorded variables can be stored in the table along with the corresponding characterization set point values.

The recorded variables that form the characterization information for each set point can include some or all of: (1) a desired (e.g., optimum) relative delay between the RF signal delivered to the power amplifier 17 and the supply shaping signal passing through the supply control branch 48;

(2) a compression level of the power amplifier 17, which can correspond to a degree of compression the power amplifier 17 is operating at during peak envelope power; and (3) a maximum envelope power. FIGS. 6A-6B provide examples of portions 600, 650 of tables including recorded variables that characterize embodiments of a power amplifier system. Such tables can form or be used to generate a portion of the equalizer table 41, for example. The characterization process will be described in further detail herein, e.g., with respect to FIGS. 4A, 4B, 5, and 6A-6B.

During operation, complex impedance (e.g., VSWR and/or phase) are detected with the impedance detector 44. The impedance detector 44 can be implemented in any appropriate fashion, and can include digital or analog circuitry. For instance, some or all of the impedance detector 44 may be implemented within the baseband processor 34 as shown. In other embodiments, some or all of the impedance detector resides in the feedback path outside of the baseband processor 34. Some examples of compatible components for detecting complex impedance are provided in U.S. Pat. No. 8,723,531, titled "Integrated VSWR Detector for Monolithic Microwave Integrated Circuits", which is incorporated by reference herein. One embodiment of a process for determining complex impedance is shown and described herein with respect to FIG. 9.

As shown, the equalizer table 41 can include one or both of a tx table 42 and a supply control table 43. The tx table 42 can be used to compensate the DPD table 40 to account for mismatch, non-linearity, etc., while the supply control table 43 can be used to control a delay of the delay component 33 of the supply control branch 48, e.g., based on the desired relative delay between the RF transmit signal 49 and the supply shaping signal.

As represented by the dashed line extending from the tx table 42 to the tx signal 49, the tx table 42 can be used to directly compensate the tx signal 49 instead of or in addition to compensating the DPT table 40. For instance, in some cases the power amplifier system 26 may be placed in a mode where DPD is turned off, and the tx table 42 is used to compensate the tx signal 49. As an example, DPD and envelope tracking are disabled until a certain transmit power level (e.g., 100 milliwatts) is reached, at which point turning on envelope tracking and DPD become more energy inefficient. Moreover, in some cases only one of the tx table 42 and the supply control table 43 are utilized at any given time. For instance, the supply control table 43 in some embodiments is only employed when the power amplifier system 26 is placed in an envelope tracking mode, and while the power amplifier system 26 not in envelope tracking mode (e.g., while in APT or fixed supply modes), only the tx table 42 is employed. In some embodiments, the equalizer table 41 includes only one of the tx table 42 and the supply control table 43. Moreover, the information contained in the equalizer table 41 may be organized in a variety of different fashions. For instance, while shown as separate tables, the tx table 42 and supply control table 43 can be combined into a single table, or, in other embodiments, the information provided in the equalizer table 41 is combined together with the DPD table 40.

For wideband signals such as 50 resource block (RB) LTE signals, memory effects can become a particularly significant problem due to loadline and delay variations across the RB frequency span. At VSWR of 2:1 or greater, a memoryless DPD table 40 may be insufficient to address AM-AM/AM-PM response variation across the channel. In such cases, equalization of the baseband transmit signal (e.g., I/Q signal) may be appropriate, e.g., using the equalizer table 41, which may enhance the DPD table 41 with memory coefficients. Use of the equalizer table 41 can implement an equalizer function that equalizes the compression level of the power amplifier 17 and/or achieves desired (e.g., optimum) delay of the power amplifier 17 across the band. Thus, the equalizer table 41, which may include the variables described above extracted across the channels, can be used to perform an equalizer function to a large RB signal (e.g., 50 or 100 RB or uplink CA 40 megahertz wide). According to certain embodiments, the equalization can provide a dual role of adding memory effect compensation to the memoryless DPD as well as adapting the DPD to work under various characterized conditions (e.g., characterized VSWR conditions). As described, the equalizer function can have two paths, one for the RF transmit signal 49, e.g., through the use of the TX table 42, and one for the supply control path 48 (e.g., through the use of the supply control table 43), which may be an envelope tracker, for example.

According to some implementations, the equalization table 41 includes separate gain and delays for each individual RB, which are applied only to the RF transmit signal 49, and there is no separate equalization for the supply control path 48. In another embodiment, the equalization table 41 implements a function approaching a truncated Volterra series via two separate paths: one for the RF transmit signal 49 and one for the envelope tracker path 48. Such an implementation may consist of an Finite Impulse Response (FIR) filter followed by a non-linear lookup table followed by another FIR. One block is applied to the RF signal while another block is applied to the modulator signal. The FIR coefficients as well as the non-linear lookup tables are derived from the equalization table and the nominal condition memoryless DPD table.

Exemplary Front End Modules

Figure 4:
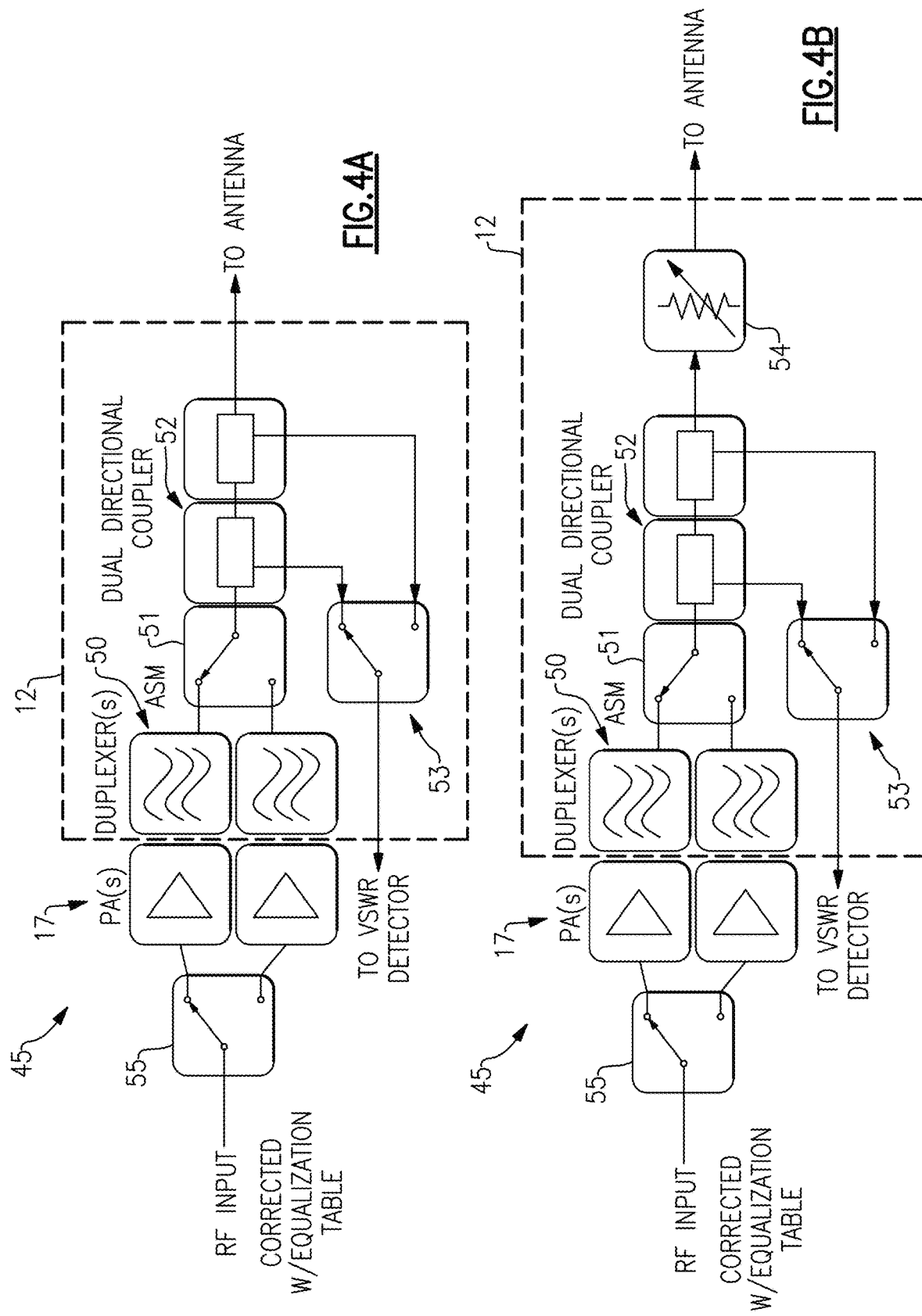
FIG. 4A is a schematic diagram of one embodiment of a front end module without an integrated antenna tuner.
FIG. 4B is a schematic diagram of one embodiment of a front end module with an integrated programmable antenna tuner.

FIGS. 4A and 4B show exemplary front end modules 45, either of which are compatible with and may be incorporated into the systems shown in FIGS. 1-3. Referring to both FIGS. 4A and 4B, the illustrated front end modules 45 includes an input switch 55, a set of power amplifiers 17, a set of duplexers 50, an antenna switch module 51, a dual directional coupler 52, and a measurement switch 53. The front end module 45 shown in FIG. 4B also includes an integrated antenna tuner 54.

The input switch 55 switches the modulated RF transmit signal between the different power amplifiers 17 and corresponding duplexers 50. The switched-in power amplifier 17 amplifies the received signal and forwards the amplified signal to the duplexer 50. The duplexer 50 is configured to forward the transmitted signal to the antenna switch module 51. For the sake of simplicity, only the transmit path is shown in FIGS. 4A-4B. However, it will be understood that the duplexer 50 is configured to allow for bi-directional communication between the transceiver 13 and the antenna 14. For instance, the duplexer 50 can be additionally configured to accept a receive signal from the antenna switch module 51 and forward the received signal for delivery to the transceiver 13. The duplexer 50 can additionally implement filtering or other appropriate functionality. For instance, the duplexer 50 may provide rejection of transmitter noise at the receive frequency, isolation to prevent receive desensitization, etc.

The antenna switch module 51 can be configured to electrically connect the antenna 14 to a selected transmit or receive path. Thus, the antenna switch module 51 can provide a number of switching functionalities associated with operation of the front end module 45. In certain embodiments, the antenna switch module 51 can include a number of switches configured to provide functionalities associated with, for example, switching between different bands, switching between different power modes, switching between transmission and receiving modes, or some combination thereof. The antenna switch module 51 can also be configured to provide additional functionality, including filtering and/or duplexing of signals.

The illustrated embodiment includes a dual directional coupler 52 capable of providing a sensed output signal to the measurement switch 53. The measurement switch 53 can be a single pole, double throw (SPDT) switch, for example. According to certain embodiments, including the illustrated embodiment, the directional coupler is capable of providing a measure of both incident and reflected signals (e.g., forward and reverse power) in the transmit path. For instance, the dual directional coupler 52 can have at least four ports, which may include an input port configured to receive signals generated by the power amplifier 17, an output port coupled to the antenna 14, a first measurement port configured to provide forward power to the measurement switch 53, and a second measurement port configured to provide reverse power to the measurement switch 53. While the illustrated embodiment includes a dual directional coupler 53, other types of devices or combinations of devices can be used in other embodiments. In general, any device can be used that is capable of detecting both incident and reflected signals (e.g., forward and reverse power) in the transmit path. The dual directional coupler 52 outputs the transmit signal for delivery to the antenna and outputs forward and reverse power signals to the measurement switch 53. The measurement switch 53 switches between the two ports (e.g., between detected forward and reverse power signals), and forwards the switched output for delivery to the impedance detector.

In contrast to the front end module 45 shown in FIG. 4B, the front end module 45 shown in FIG. 4A does not include a programmable antenna tuner. In such an embodiment, memory effects such as those due to mismatch may be compensated for adequately using the equalizer table 41, without the use of an integrated antenna tuner, thereby reducing cost and complexity, and also avoiding losses that can be caused by incorporation of an antenna tuner. In such cases, a programmable antenna tuner may be temporarily connected to the system, e.g., between the dual directional coupler 52 and the antenna in order to characterize the system. For instance, the antenna tuner can be used during manufacture to set the complex impedance values for each characterization set point. The configuration shown in FIG. 4A can be used in combination with the pre-characterized equalizer table 41 according to some embodiments to achieve a linearity improvement of at least 6 dB.

In some other embodiments, such as the one shown in FIG. 4B, an integrated antenna tuner 54 is provided within the front end module 45. The antenna tuner 54 in some embodiments includes a circuit including a pi-network and/or T-network. The antenna tuner 54 can be programmable to provide impedance tuning and in some embodiments is used in combination with the equalizer table 41 to compensate for memory effects. For instance, the programmable antenna tuner 54 can be used to provide a coarse correction of certain non-linearities (e.g., AM-AM and/or AM-PM response variation, memory effects, etc.). The antenna tuner 54 can be adjusted to provide an impedance tuning function, such that the power amplifier 17 sees a particular impedance that is closer to a desired value (e.g., 50 ohms), thereby providing VSWR compensation. The equalizer table 41, on the other hand, can be used to provide for fine correction for certain non-linearities (e.g., AM-AM and/or AM-PM response variation, memory effects, etc.). Including an integrated antenna tuner 54 can provide an additional benefit of providing calibration for the dual directional coupler 52. For instance, directivity of the coupler 52 can be software or firmware enhanced after calibration by de-embedding, linear transformation, etc. The integrated tuner 54 can also provide improved performance under server mismatch conditions.

Characterization of the front end module 45 can be done with any desired frequency, including on a part by part basis, or, in order to reduce calibration costs, on a one part per lot basis or a one part per several lots basis.

Examples of Methods for Pre-Characterizing Front End Modules

Figure 5:
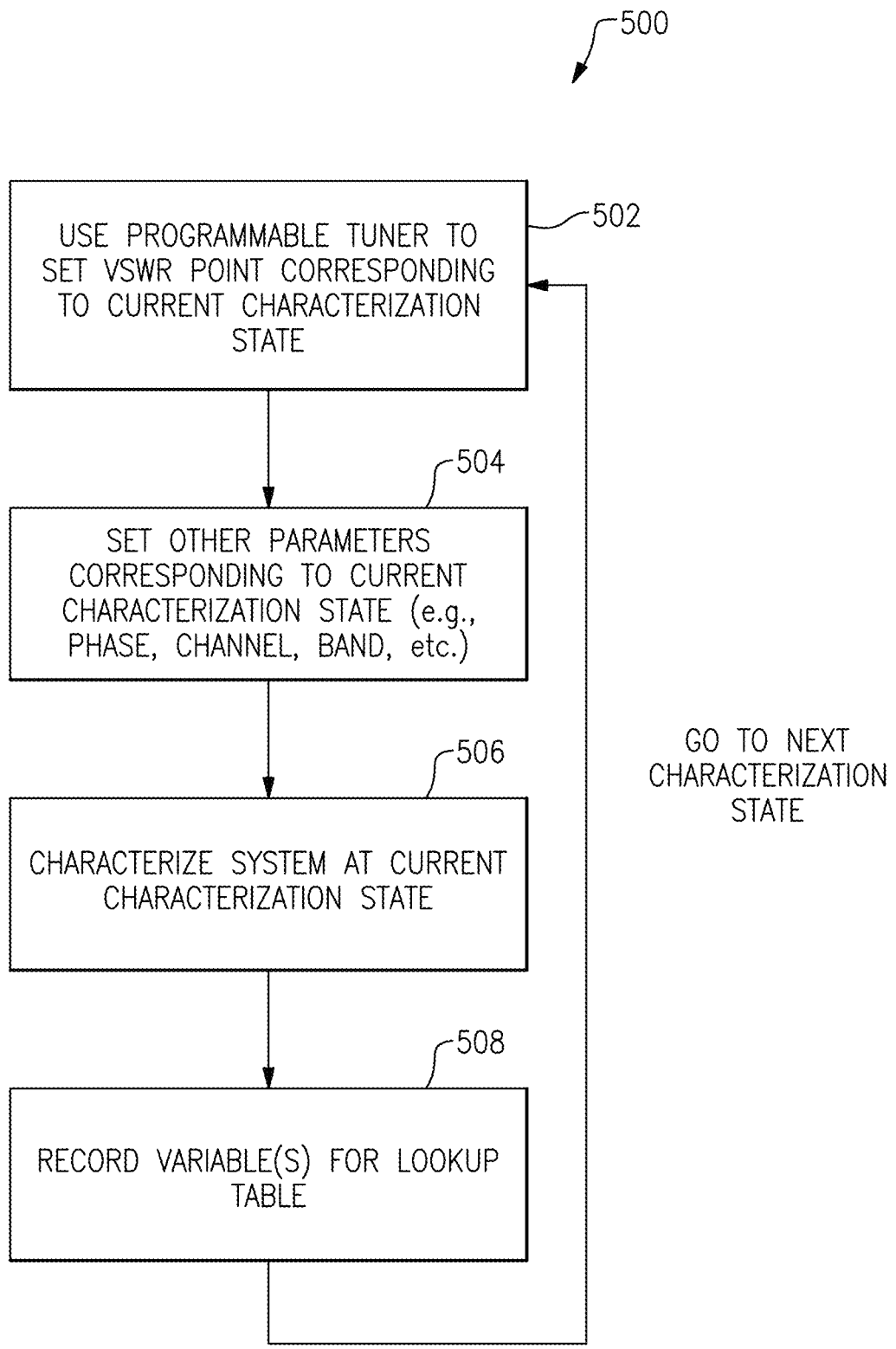
FIG. 5 is a flow chart depicting a process for pre-characterizing a front end module.
Figure 6A:
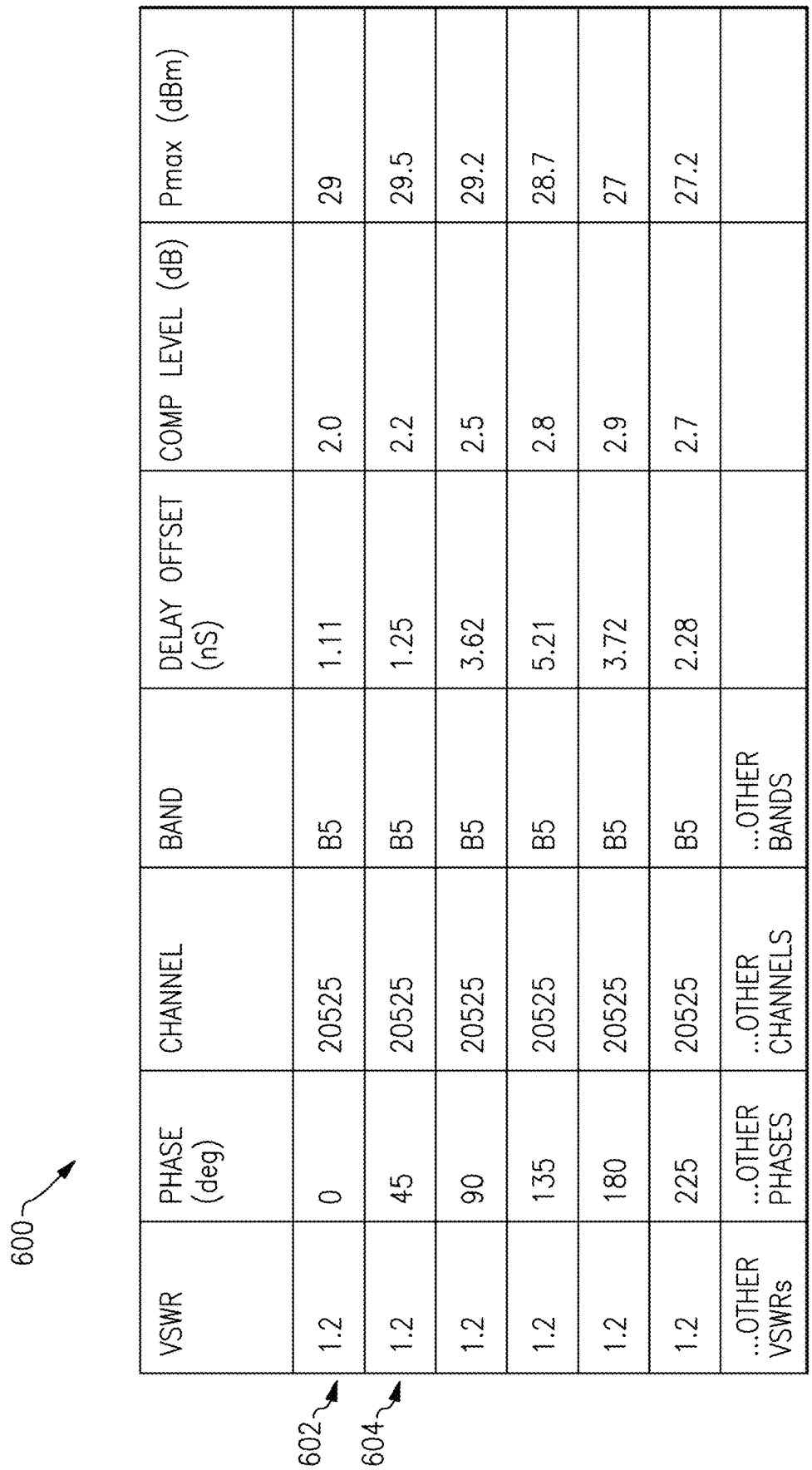

FIG. 5 is a flow chart 500 depicting a process for pre-characterizing a front end module. The process 500 may result in a measurement of AM-AM and/or AM-PM response curves for each individual characterization state. One or more processors and/or other appropriate components of a wireless device may implement certain portions of the process. For instance, while certain portions of the process are described for the purposes of illustration as being implemented using certain components of the devices shown in FIGS. 3 and 4A-4B, the process could be implemented using the wireless device 11 of FIG. 1, or any other compatible wireless device 11.

At block 502, the process includes using a programmable antenna tuner to set the VSWR to the appropriate value for the current characterization set point state. For instance, referring to the first row 602 shown in the example partial equalizer lookup table 600 shown in FIG. 6A, the antenna tuner can be used to set the VSWR to the value (1.2) corresponding to the current characterization set point state. Where an integrated antenna tuner 54 is provided (FIG. 4B) in the front end module 45 the integrated tuner 54 may be used to adjust the VSWR. Where integrated tuner is not provided (FIG. 4A), an antenna tuner may be attached to the front end module 45 temporarily, for the purposes of characterization. The antenna tuner may be adjusted while the integrated impedance detector 44 or other detector is used to monitor the VSWR point, until the set point is reached.

At block 504, the other parameters corresponding to the current characterization set point are set to the appropriate values. For instance, referring again to the example set point corresponding to the first row 602 in the partial lookup table 600 shown in FIG. 6A, the phase of the complex impedance, the channel, and the band can be set to the appropriate values (0 degrees, 20525, B5). Some or all of these set points can be achieved by adjusting a test input signal using a signal generator or other appropriate tool.

At block 506, the system is characterized at the current characterization state. For instance, a set of variables associated with behavior of the front end module 45 are recorded at 506. The variables can generally include any appropriate variable or measurement that can be used to compensate for non-linearity of the front end module 45. For instance referring again to the first row 602 of the partial table 600 shown in FIG. 6A, the variables in that exemplary embodiment include (1) a measured desired (e.g., optimum) relative delay (1.11 nanoseconds [ns]) between the RF signal delivered to the power amplifier 17 and the supply shaping signal passing through the supply control branch 48; (2) a compression level (2.0 dB) of the power amplifier 17, which can correspond to a degree of compression the power amplifier 17 is operating at during peak envelope power; and (3) a maximum envelope power (29 Decibel-milliwatts [dBm]). Referring to FIG. 6B, which includes another example of a partial lookup table 650, the recorded variables can also include: AM-AM coefficients (Var B) and AM-PM coefficients (Var C) characterizing the AM-AM and AM-PM response curves.

At block 508, the variables are recorded into the lookup table 41, or are otherwise stored in non-volatile memory. In certain implementations, the variables are directly recorded at the time of characterization into a non-volatile memory within the transceiver 13 (e.g., to form the equalizer table 41). In other cases, the variables are recorded to some separate storage medium (e.g., a flash drive, disk drive, or the like), and are downloaded into the baseband processor 34 or other appropriate location within the wireless device 11 at a later point in time. For instance, in some cases, the front end module 12 is characterized prior to assembly of the wireless device 11, and the recorded values are downloaded into non-volatile memory accessible by the baseband processor 34 or to some other appropriate location within the wireless device 11 at the point of assembly of the wireless device 11 or portion thereof.

The process then repeats for the next characterization set point. Again referring to FIG. 6A, the next set point may correspond to the second row 604 in the partial table 600, where the phase value is set to 45 degrees.

FIG. 6A shows only a portion of the characterization table where phase is swept in increasing values while holding the other set point parameters (VSWR, Channel, and Band) constant. It will be understood that in order to complete the characterization and thereby obtain a complete set of recorded values for use in the equalization table 41, the phase may be swept through additional values (e.g., through 360 degrees), and each of the other set point parameters may also be swept while holding some or all of the other parameters constant.

While the partial tables 600, 650 shown in FIGS. 6A-B are referred to herein as forming a portion of an equalizer table 41, the values in the partial tables 600, 650 in some cases are not actually directly stored in the equalizer table 41. Instead, the recorded values from the tables 600, 650 are used to derive the values included in the equalizer table 41. For example, the AM-AM coefficients (Var B) and AM-PM coefficients (Var C) shown in the partial table 650 of FIG. 6B may be derived from other variables recorded during characterization.

According to certain embodiments, some or all of the characterization process 500 is performed while DPD is disabled.

FIGS. 7A and 7B show example processes for compensating front end module operation using an equalizer table having values obtained during a characterization of the front end module. For instance, the processes may involve the use of the equalizer table 41 shown in FIG. 3, which may be obtained using the process shown in FIG. 5, or a similar process. While certain portions of the process are described for the purposes of illustration as being implemented by the baseband processor 34 within the transceiver 13 of the power amplifier system 26 of FIG. 3, the process could be implemented by any other appropriate processor, such as by another processor within the transceiver 13 of the power amplifier system 26 of FIG. 3, by any processor within the wireless device 11 of FIG. 2, etc.

Referring to FIG. 7A, at block 702 the baseband processor 34 receives a complex impedance value (e.g., VSWR and/or phase) sensed by the impedance detector 44 during signal transmission.

At block 704, the baseband processor 34 uses the sensed impedance value to access the appropriate record from the equalizer table 41. For instance, referring to the partial tables 600, 650 shown in FIGS. 6A-6B, the VSWR may be used along with the other characterization set point parameters (e.g., phase, channel, and band information) to index the equalizer table 41. The phase, channel and band information may be known by the baseband processor 34 based on the current operating settings of the wireless device 11, or in some cases one or more of the phase, channel, and band can be derived from the sensed feedback signal.

At block 706, the baseband processor 34 applies a correction based on the accessed record. Depending on the embodiment, the accessed record from the equalization table 41 may include values for one or more of the variables recorded during characterization (e.g., RF vs. envelope tracker delay, compression level, and Pmax). In such cases, the baseband processor 34 may process the variable to apply the appropriate correction. Taking the power amplifier compression as an example, the baseband processor 34 may adjust the input signal to achieve the desired level of compression. For example, if a compression level of 2.0 dBm is specified in the accessed record, and the current gain is determined to be 2.7 dBm, the baseband processor 34 may lower the input signal level accordingly. With respect to the delay offset amount, the baseband processor 34 may set the programmable delay of the delay component 33 in accordance with the delay offset specified in the accessed record.

The indexed record may in some cases include values derived from the variables. For instance, where the record is used to compensate the DPD table, correction values may be derived from the recorded variables and stored in the equalizer table 41.

FIG. 7B shows another process 750 of compensating front end module operation using a pre-characterization lookup table. Similar to the process 700 of FIG. 7A, the baseband processor 34 receives the sensed complex impedance value at block 752.

At block 754, a coarse tuning function is performed using an antenna tuner 54 that is integrated within the front end module 45. As described previously with respect to FIG. 4B, the programmable antenna tuner 54 may be tuned to compensate to some degree for sensed mismatch, e.g., to tune the impedance load seen by the power amplifier 17 to be closer to a desired value (e.g., closer to 50 ohms), thereby reducing VSWR.

At block 756, the baseband processor 34 uses sensed impedance value to access the appropriate record from the equalizer table 41, similar to block 704 of the process 700 of FIG. 7A. At block 758, the baseband processor 34 applies a fine-tuning correction based on the accessed record in a manner similar to block 706 of the process 700 of FIG. 7B. For instance, the fine-tuning may compensate for non-linearities (e.g., memory effects) of relatively smaller magnitude than those accounted for by the coarse correction achieved using the antenna tuner 54.

Examples of Power Amplifier Supply Modes

FIGS. 8A-8C shows waveforms for power amplifiers operating in a fixed supply voltage mode, an average power tracking (APT) mode, and an envelope tracking mode, respectively.

In FIG. 8A, a graph illustrates the voltage of a RF signal 804 and a power amplifier supply voltage 802 versus time. The RF signal 804 has a signal envelope 805. It can be important that the power amplifier supply voltage 802 of the power amplifier has a voltage level greater than that of the RF signal 804. For example, providing a supply voltage to a power amplifier having a magnitude less than that of the RF signal 804 can clip the signal, thereby creating signal distortion and/or other problems. Thus, it is important that the power amplifier supply voltage 802 be greater than that of the signal envelope 805. However, it can be desirable to reduce a difference in voltage between the power amplifier supply voltage 802 and the signal envelope 805 of the RF signal 804, as the area between the power amplifier supply voltage 802 and the signal envelope 805 can represent lost energy, which can reduce battery life and increase heat generated in a mobile device.

FIG. 8B is a graph illustrating a power amplifier supply voltage 808 that varies or changes in relation to the signal envelope 807 of the RF signal 810. The graph shown in FIG. 8B my correspond to an average power tracking (APT) mode of power amplifier operation. In contrast to the power amplifier supply voltage 802 of FIG. 8A, the power amplifier supply voltage 808 of FIG. 4B changes in discrete voltage increments during different time slots, delineated by the dashed lines. The amplifier supply voltage 808 during a particular time slot may be adjusted based on the average power of the envelope 807 during that time slot, for example. For instance, the slot on the right may correspond to a lower power mode of operation than the slot on the left. By lowering the supply voltage during certain time slots, APT operation can improve power efficiency as compared to the fixed supply operation shown in FIG. 8A.

In FIG. 8C, a graph illustrates the voltage of a RF signal 816 and a power amplifier supply voltage 814 versus time. The graph shown in FIG. 8C may correspond to an envelope tracking mode of power amplifier operation. In contrast to the power amplifier supply voltage 802 of FIG. 8A, the power amplifier supply voltage 814 of FIG. 8B varies or changes in relation to the signal envelope 815. The area between the power amplifier supply voltage 814 and the signal envelope 815 in FIG. 8C is less than the area between the power amplifier supply voltage 802 and the signal envelope 805 in FIG. 8A, and thus the graph of FIG. 8C can be associated with a power amplifier system having greater energy efficiency. By tracking the supply voltage to the envelope, envelope tracking operation can improve power efficiency as compared to both the fixed supply operation shown in FIG. 8A and the APT mode shown in FIG. 8B.

Although FIGS. 8A-8C illustrate three examples of power amplifier supply voltage versus time the teachings herein are applicable to other configurations of power supply generation. For example, the teachings herein are applicable to configurations in which a supply voltage module limits a minimum voltage level of the power amplifier supply voltage.

Example Method of Determining Complex Impedance

Figure 9:
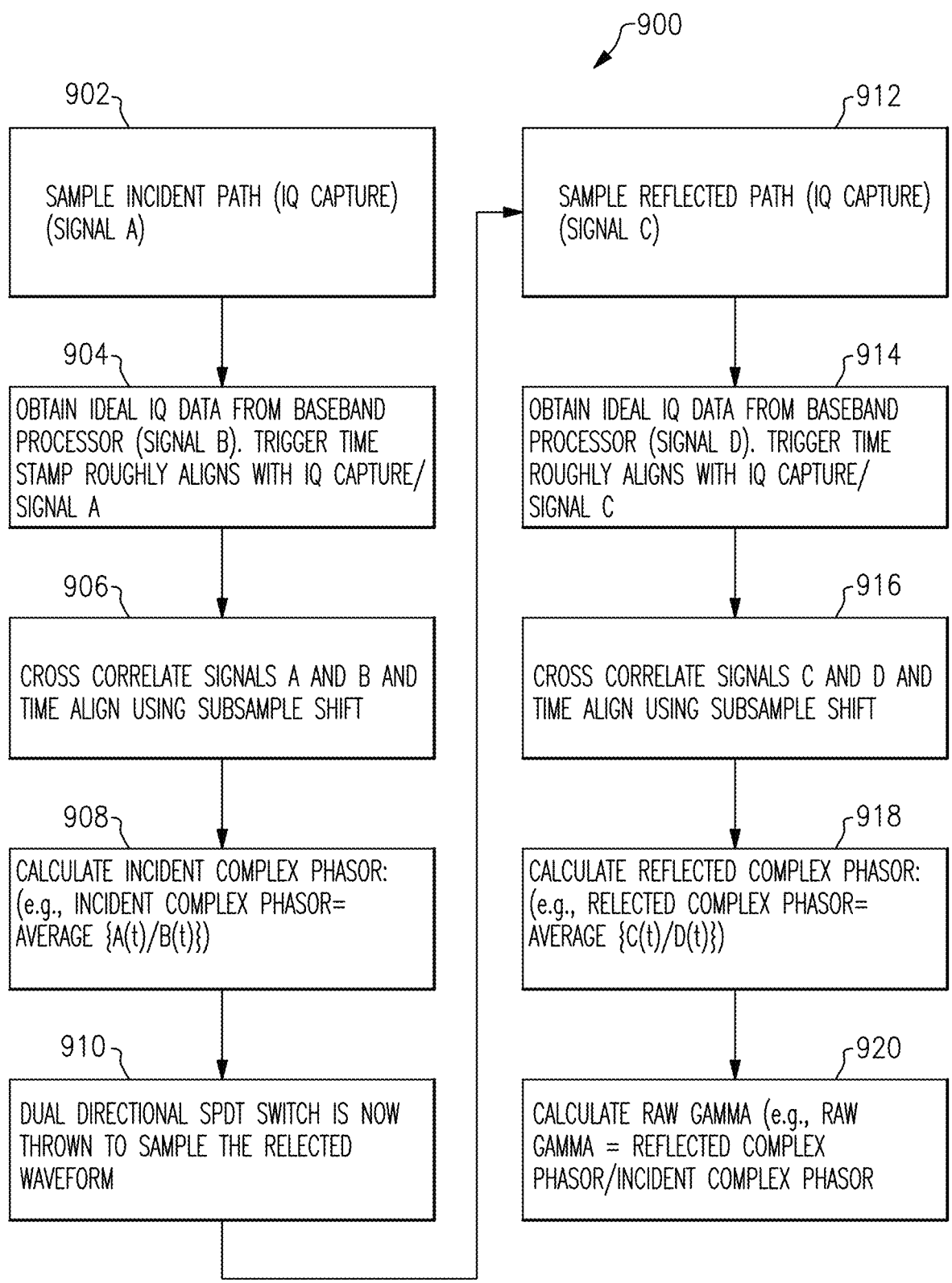
FIG. 9 shows one embodiment of a process for determining complex impedance.

FIG. 9 shows a flowchart of one example method 900 for determining complex impedance. The determined impedance may be used to access records in the equalizer table 41 and/or or during the characterization process, for example.

At block 902 the method 900 includes sampling the incident transmit signal path, e.g., where the measurement switch 53 is switched to receive the forward power signal from the corresponding port of the dual directional coupler 52. At block 904, the method includes obtaining ideal I/Q data from the baseband processor 34. For instance, the I/Q data can correspond to the transmitted data stream prior to the data stream being impacted by mismatches and other effects within the front end module 45. At block 906, the baseband processor 34 or other appropriate component cross-correlates and time aligns the ideal I/Q data and the I/Q data received from the front end module 45 for the incident path. For instance, the baseband processor 34 may use a subsample shift technique. At block 908, the baseband processor 34 or other appropriate component calculates a complex phasor associated with the incident signal, which may be calculated according to the exemplary equation shown in block 908 of FIG. 9.

At block 910, the power amplifier system 26 switches the measurement switch 53 such that the switch is coupled to the reverse power signal from the corresponding port of the dual directional coupler 52. At block 912, the reflected transmit signal path is sampled. At block 914, the method includes obtaining ideal I/Q data from the baseband processor 34, which may correspond to the transmitted data stream prior to the data stream being impacted by mismatches and other effects within the front end module 45. At block 916, the baseband processor 34 or other appropriate component cross-correlates and time aligns the ideal I/Q data and the I/Q data received from the front end module 45 for the reflected path. For instance, the baseband processor 34 may use a subsample shift technique. At block 918, the baseband processor 34 or other appropriate component calculates a complex phasor associated with the reflected signal, which may be calculated according to the exemplary equation shown in block 918 of FIG. 9.

At block 920, the baseband processor 34, impedance detector 44, or other appropriate component calculates the raw gamma (e.g., complex impedance). The raw gamma may be calculated by dividing the calculated reflected complex phasor by the incident complex phase, for example.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of pre-characterizing a front end module of a wireless device, the method comprising:

tuning an impedance load at an output of a power amplifier of the front end module so as to achieve a voltage standing wave ratio value associated with a first characterization state of a plurality of front end module characterization states corresponding to different input conditions;

driving the front end module with a radio frequency transmit signal, the radio frequency transmit signal driven according to one or more parameter values associated with the first characterization state of the plurality of front end module characterization states;

measuring a plurality of variables associated with behavior of the front end module while the front end module is driven with the radio frequency transmit signal and tuned to the voltage standing wave ratio value, the plurality of measured variables including at least a desired relative delay, a peak envelope power, and a compression level corresponding to a degree of compression when the power amplifier is operating at the peak envelope power for the first characterization state;

recording one or more of the plurality of measured variables associated with the first characterization state in an equalization table contained in non-volatile memory of the wireless device; and deriving AM-AM or AM-PM coefficients of a polynomial from the plurality of variables measured during characterization, the derived coefficients representative of a non-linear AM-AM or AM-PM response curve.

2. The method of claim 1 wherein the one or more parameters include one or more of a phase of a complex impedance, a channel, and a band.

3. The method of claim 1 wherein the non-volatile memory is mounted on the wireless device and accessible by a processor of the wireless device.

4. The method of claim 1 wherein said tuning is performed using a programmable antenna tuner that is separate from the front end module, and the front end module does not include an antenna tuner.

5. The method of claim 1 wherein said tuning is performed using a programmable antenna tuner that is integrated into the front end module.

6. The method of claim 1 wherein the one or more recorded measured variables include a power amplifier compression.

7. The method of claim 1 wherein the one or more recorded measured variables include a maximum envelope power.

8. The method of claim 1 wherein the one or more recorded measured variables include a delay between a power control signal for the power amplifier and the radio frequency transmit signal.

9. The method of claim 1, further comprising repeating said steps of tuning, driving, measuring, and recording for a plurality of additional characterization states of the plurality of front end module characterization states, such that the equalization table is populated with a plurality of entries associated with the plurality of front end module characterization states and corresponding to different input conditions.

10. A method of characterizing a wireless device, the method comprising:

tuning an impedance load at an output of a power amplifier of the wireless device in accordance with a first characterization state, to a tuned impedance load value;

driving the power amplifier with a radio frequency transmit signal;

measuring a plurality of variables associated with behavior of the radio frequency system while the power amplifier is driven with the radio frequency transmit signal and while the impedance load is tuned to the tuned impedance load value, the plurality of measured variables including at least a desired relative delay, a peak envelope power, and a compression level of the power amplifier corresponding to a degree of compression when the power amplifier is operating at the peak envelope power for the first characterization state;

recording one or more of the plurality of measured variables in associated with the first characterization state in an equalization table contained in a memory of the wireless device; and deriving AM-AM or AM-PM coefficients of a polynomial from the plurality of variables measured during characterization, the derived coefficients representative of a non-linear AM-AM or AM-PM response curve.

11. The method of claim 10 wherein the tuned impedance load value is a voltage standing wave ratio value.

12. The method of claim 10 wherein said driving includes adjusting the radio frequency transmit signal in accordance with one or more parameters associated with the first characterization state.

13. The method of claim 12 wherein the one or more parameters include one or more of a phase of a complex impedance, a channel, and a band.

14. The method of claim 10 wherein the memory is mounted on the wireless device and accessible by a processor of the wireless device.

15. The method of claim 10 wherein said tuning is performed using a programmable antenna tuner that is separate from the wireless device.

16. The method of claim 10 wherein said tuning is performed using a programmable antenna tuner that is integrated with the wireless device.

17. The method of claim 10 wherein the one or more recorded measured variables include a power amplifier compression.

18. The method of claim 10 wherein the one or more recorded measured variables include a maximum envelope power.

19. The method of claim 10 wherein the one or more recorded measured variables include a delay between a power control signal for the power amplifier and the radio frequency transmit signal.

20. The method of claim 10, further comprising repeating said steps of tuning, driving, measuring, and recording for a plurality of additional characterization states of the plurality of front end module characterization states, such that the equalization table is populated with a plurality of entries associated with the plurality of front end module characterization states and corresponding to different input conditions.

* * * * *